US009349621B2

(12) United States Patent
Singh

(10) Patent No.: US 9,349,621 B2
(45) Date of Patent: May 24, 2016

(54) VACUUM SEAL ARRANGEMENT USEFUL IN PLASMA PROCESSING CHAMBER

(75) Inventor: Harmeet Singh, Fremont, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 262 days.

(21) Appl. No.: 13/113,605

(22) Filed: May 23, 2011

(65) Prior Publication Data
US 2012/0299252 A1 Nov. 29, 2012

(51) Int. Cl.
F16L 17/06 (2006.01)
H01L 21/67 (2006.01)
F16J 15/06 (2006.01)

(52) U.S. Cl.
CPC ......... H01L 21/67126 (2013.01); F16J 15/062 (2013.01)

(58) Field of Classification Search
CPC ............. F16J 15/062; H01L 21/67126
USPC .................................. 277/643, 644
See application file for complete search history.

(56) References Cited

U.S. PATENT DOCUMENTS

| 3,181,873 | A | * | 5/1965 | Reed ............................. 277/346 |
| 3,191,949 | A | | 6/1965 | Lansky et al. |
| 3,542,382 | A | | 11/1970 | Hagmann |
| 3,831,951 | A | | 8/1974 | Patel et al. |
| 3,865,386 | A | * | 2/1975 | Wilke .......................... 277/529 |
| 3,990,711 | A | * | 11/1976 | Hill .............................. 277/451 |
| 4,902,023 | A | | 2/1990 | Opresko et al. |
| 4,993,720 | A | | 2/1991 | Ciotola |
| 5,090,871 | A | * | 2/1992 | Story et al. ..................... 417/9 |
| 5,513,859 | A | | 5/1996 | Huber et al. |
| 5,564,177 | A | * | 10/1996 | Fernandes et al. ............. 29/451 |
| 5,578,132 | A | | 11/1996 | Yamaga et al. |
| 5,607,167 | A | | 3/1997 | Franckx |
| 5,629,657 | A | * | 5/1997 | Bayorgeon et al. ........... 333/254 |
| 5,716,051 | A | * | 2/1998 | Cornea et al. ................. 277/609 |
| 5,904,773 | A | | 5/1999 | Himes |
| 6,010,133 | A | | 1/2000 | Boyd et al. |
| 6,032,419 | A | | 3/2000 | Hurwitt |
| 6,523,833 | B1 | | 2/2003 | Ishigaki et al. |
| 6,536,777 | B2 | | 3/2003 | Hao et al. |
| 6,547,256 | B2 | * | 4/2003 | Aksit et al. ..................... 277/628 |
| 6,578,691 | B1 | | 6/2003 | Ashbrook |
| 6,592,128 | B2 | | 7/2003 | White |
| 6,676,135 | B2 | | 1/2004 | Carey |
| 6,761,360 | B2 | * | 7/2004 | Hammi .......................... 277/630 |
| 6,821,378 | B1 | | 11/2004 | Daugherty et al. |
| 6,942,222 | B2 | * | 9/2005 | Fink .............................. 277/608 |
| 6,962,348 | B2 | | 11/2005 | Fink |
| 7,011,294 | B1 | | 3/2006 | Ehrne et al. |
| 7,070,187 | B2 | | 7/2006 | Boeve |
| 8,069,704 | B2 | * | 12/2011 | Ishibashi et al. ................ 73/37 |
| 8,079,600 | B2 | * | 12/2011 | Shojima et al. ............... 277/644 |
| 2004/0080120 | A1 | * | 4/2004 | Fink .............................. 277/608 |
| 2005/0098106 | A1 | | 5/2005 | Fink et al. |
| 2008/0029972 | A1 | | 2/2008 | Smathers et al. |

(Continued)

Primary Examiner — Gilbert Lee
Assistant Examiner — Thomas Neubauer
(74) Attorney, Agent, or Firm — Buchanan Ingersoll & Rooney

(57) ABSTRACT

A vacuum seal arrangement comprising a one-piece elastomeric gasket having at least first and second O-rings interconnected by a planar web, a first part having a first planar sealing surface with a dove-tail groove therein holding the first O-ring and a square walled groove therein holding the second O-ring, the first part further including at least one passage in the first planar sealing surface surrounded by the first O-ring or second O-ring.

9 Claims, 2 Drawing Sheets

(56) References Cited

U.S. PATENT DOCUMENTS

2008/0302761 A1* 12/2008 Hirayama et al. .............. 216/67
2009/0160137 A1 6/2009 Smathers et al.
2010/0117308 A1* 5/2010 Dell'Eva et al. .............. 277/628
2010/0170857 A1* 7/2010 Williams et al. .............. 210/741

* cited by examiner

VACUUM SEAL ARRANGEMENT USEFUL IN PLASMA PROCESSING CHAMBER

BACKGROUND

O-rings used for vacuum sealing applications such as plasma etching reactors require appropriately designed grooves to position the O-rings against the sealing surfaces. See, for example, commonly-owned U.S. Pat. Nos. 6,010,133 and 6,536,777, the disclosures of which are hereby incorporated by reference. A single or double dove-tailed groove is typically used to position the O-ring and to prevent the O-ring from falling out during the installation process. However, when multiple small O-rings need to be placed close to each other, there might be insufficient distance to accommodate the O-ring grooves on the parts to be sealed.

SUMMARY

Disclosed herein is a vacuum seal arrangement comprising a one-piece elastomeric gasket having at least first and second O-rings interconnected by a planar web, a first part having a first planar sealing surface with a dove-tail groove therein holding the first O-ring and a square walled groove therein holding the second O-ring, the first part further including at least one passage in the first planar sealing surface surrounded by the first O-ring or second O-ring.

In one embodiment, the first and second O-rings are concentric and the square walled groove is inside the dove-tail groove. Preferably, the first and second O-rings have the same wall thickness, the dove-tail groove is a single dove-tail groove having an inner straight wall and an outer inclined wall and the square walled groove has inner and outer walls oriented 90° to the first planar sealing surface, the open grooves having a depth less than the O-ring wall thickness and a central axis coincident with the central axis of the passage.

In another embodiment, the gasket includes three, four or five additional O-rings mounted in grooves in square walled grooves in the first planar sealing surface. For example, there can be five additional O-rings identical in shape and having the same diameters and wall thickness as the first and second O-rings, the first O-ring arranged as a central O-ring surrounded by the second O-ring and the five additional O-rings arranged at radial positions 60° apart around the central O-ring, adjacent surfaces of the six O-rings being separated by a distance less than the wall thickness of the O-rings.

In a further embodiment, the O-rings have a thickness of about 0.1 to about 0.25 inch and the web is a flat interconnecting section between the O-rings and/or the first and second O-rings have the same size with an inner diameter of about 0.5 to about 2 inches. For example, the first and second O-rings can have a thickness of about 0.1 to about 0.25 inch and the dove-tail groove can be a single dove-tail groove with an inner straight wall and an outer inclined wall. Alternatively, the first and second O-rings can have a thickness of about 0.1 to about 0.25 inch and the dove-tail groove can be a double dove-tail groove with an inner inclined wall and an outer inclined wall.

The O-rings can be concentric or laterally offset. For example, an inner surface of the second O-ring can surround the at least one passage and the second O-ring can be inside the first O-ring. Alternatively, the at least one passage can comprise a central passage surrounded by the first O-ring and the first planar sealing surface can include six additional passages having centers thereof equidistant from the center of the central passage, the gasket including five additional O-rings and the first planar sealing surface including five additional square walled grooves, the square walled grooves holding the second O-ring and the five additional O-rings.

In one arrangement, a second part is attached to the first part and the second part includes a passage aligned with the passage in the first part. In another arrangement, a second part is attached to the first part and the second part includes seven passages aligned with the passages in the first part. In a further arrangement a second planar sealing surface is clamped against the first O-ring and a third part having a third planar sealing surface is clamped against the second O-ring.

The dove-tail groove can be separated from the square walled groove by an annular wall having an annular surface coplanar with the first planar sealing surface and the web extends over the annular surface. An outer wall of the dove-tail groove can be at an angle of 60° to 80° and the bottom of the dove-tail groove can be wider than the opening of the dove-tail groove. Preferably, the bottom of the dove-tail groove and the bottom of the square walled groove are coplanar.

In a preferred embodiment, the vacuum sealing arrangement is located in a plasma processing chamber such as a plasma etching chamber wherein the passage delivers a reactant gas to the chamber. Alternatively, the passage can be a vacuum passage or a liquid passage.

DETAILED DESCRIPTION

Disclosed herein is a novel O-ring gasket which attaches multiple O-rings to each other using a thin web of O-ring elastomer thereby reducing the number of O-ring grooves required in the sealing parts of a plasma processing chamber. The O-ring gasket can be used for gas, liquid or vacuum seals where passages are spaced close together and/or minimize particle generation due to metal on metal contact of sealing surfaces.

Figure 1:
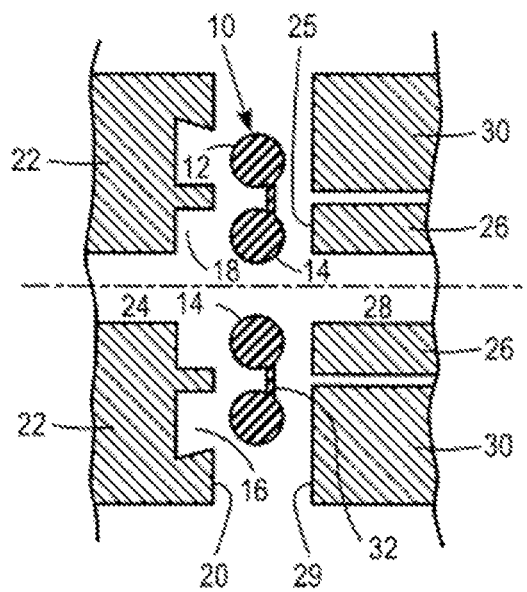
FIG. 1 is a cross-sectional view of a vacuum seal arrangement according to a first embodiment.
Figure 2:
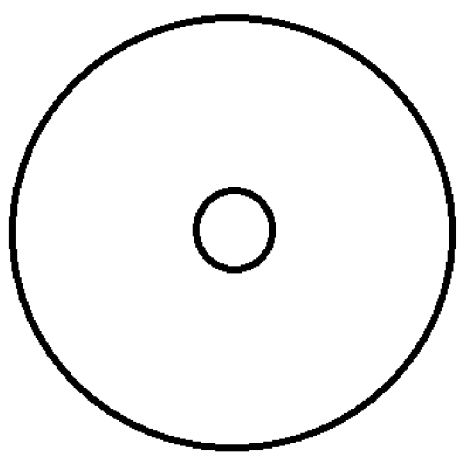
FIG. 2 is a top view of the multiple O-ring gasket shown in FIG. 1.

FIG. 1 shows an embodiment of a gasket 10 having an outer O-ring 12 and an inner O-ring 14 which fit in an outer dove-tail groove 16 and a square walled groove 18 in a planar sealing surface 20 of a first part 22 of metal or ceramic material. A passage 24 in part 22 opens into the groove 18. A planar sealing surface 25 of a second part 26 can be clamped against the inner O-ring 14 such that a passage 28 in the second part 26 is in fluid communication with the first passage 24. A planar sealing surface 29 of a third part 30 surrounding the second part 26 can be clamped against the outer O-ring 12. In this particular embodiment, there is insufficient room to allow for putting a dove-tail groove 16 for sealing part 22 to part 26. However, by attaching the smaller inner O-ring 14 to the larger outer O-ring 12 by a thin web 32, the smaller inner O-ring 14 can be retained in position by the outer O-ring 12 thereby allowing easier assembly. As shown in FIG. 2, the gasket 10 has a single passage formed by the inner periphery of the inner O-ring 14.

Those skilled in the art will recognize that the above mentioned scheme can be used for a multitude of O-ring designs that are used for sealing applications wherein passages are in close proximity.

Further, some of these O-rings may have other functions in addition to or instead of sealing. For example, in one embodiment the outer O-ring 12 acts as a vacuum seal while the inner O-ring 14 acts as a soft surface to prevent rubbing of hard surfaces against each other.

Figure 3:
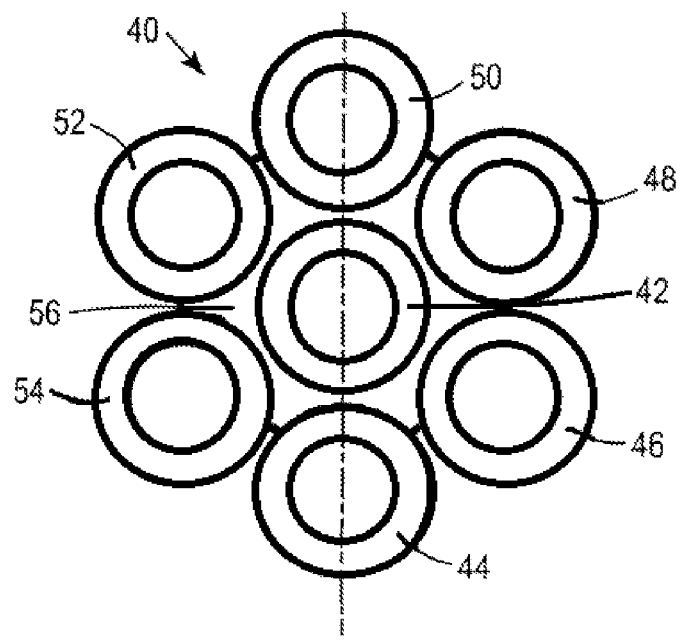
FIG. 3 is a cross-sectional view of a vacuum seal arrangement according to a second embodiment.
Figure 4:
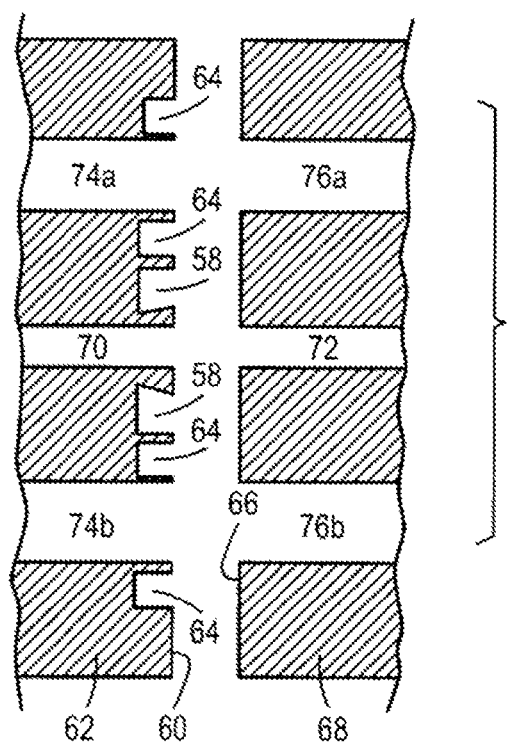
FIG. 4 is a top view of the multiple O-ring gasket shown in FIG. 2.

FIGS. 3 and 4 show another embodiment of a vacuum seal arrangement utilizing a multi-orifice gasket 40 for sealing parts that allow separate fluids such as liquids or gases to flow through discrete passages. The gasket 40 includes seven O-rings with seven passages through the gasket as shown in FIG. 3. As shown in FIG. 3, the gasket includes a center O-ring 42 surrounded by six O-rings 44, 46, 48, 50, 52, 54 connected to each other and the center O-ring 42 by web 56. The O-rings 42-56 have identical sizes and the distance between opposed surfaces of the O-rings is less than a wall thickness of the O-rings. As shown in FIG. 4, the center O-ring 42 fits in a dove-tail groove 58 in a first planar surface 60 of a first part 62 and the outer O-rings 44-52 fit in square walled grooves 64 in the first part 62. A second planar surface 66 of a second part 68 is held against the gasket 40 to allow fluid communication between a center passage 70 in the first part 62 and a center passage 72 in the second part 68. Likewise, passages 74a, 74b, etc. in the first part 62 are in fluid communication with passages 76a, 76b, etc. in the second part 68. Each fluid is thus separated from the other fluids and the atmosphere using the gasket 40. Using the attached O-ring concept, only the center O-ring 42 uses a dove-tail groove 58 for retaining the seven attached O-rings 42-52. The other six O-rings 44-54 merely sit in the open square walled grooves 64. As can be observed in FIG. 3, this arrangement allows placement of the O-rings closer to each other compared to the configuration in which each O-ring is separately held by dove-tail groove.

A preferred cross-sectional diameter of the O-rings is about 0.1 to about 0.25 inch and a preferred outside diameter of the O-rings is about 0.5 to about 2 inches. The dove-tail groove can have single inclined inner or outer wall or the inner and outer walls can be inclined towards each other such that the opening of the groove is smaller than the O-ring cross-section. Preferred materials for the O-rings include semiconductor processing comparable comparable perfluoroelastomers or fluorosilicone with or without fillers such as CaO and MgO, e.g., "VITON", "CHEMRAZ", "PERLAST", "KALREZ" or other suitable material.

It should be observed that since O-rings are typically fabricated using a mold, manufacture of the attached O-rings is not significantly more difficult compared to manufacture of a single O-ring.

Typical O-ring sealing applications require one groove per O-ring used. For applications requiring multiple O-rings in close proximity, the gasket 10, 40 reduces the number of dove-tailed O-ring grooves in the sealing parts needed compared to using separate O-rings thereby increasing the design flexibility, reducing the cost associated with dove-tailed grooves, and allowing for closer packing of hardware features, if required.

While various embodiments have been described, it is to be understood that variations and modifications may be resorted to as will be apparent to those skilled in the art. Such variations and modifications are to be considered within the purview and scope of the claims appended hereto.

All of the above-mentioned references are herein incorporated by reference in their entirety to the same extent as if each individual reference was specifically and individually indicated to be incorporated herein by reference in its entirety.

I claim:

1. A vacuum seal arrangement comprising:
   a one-piece elastomeric gasket having at least first and second O-rings interconnected by a planar web;
   a first part having a first planar sealing surface with a dove-tail groove therein holding the first O-ring and a square walled groove therein holding the second O-ring, wherein the first and second O-rings are concentric and the square walled groove is radially inward of the dove tail groove with respect to the first planar sealing surface, the first part further including at least one passage in the first planar sealing surface surrounded by the first O-ring or second O-ring, wherein the passage opens into an inner portion of the square walled groove; and
   a second part attached to the first part;
   wherein
   the second part has a passage in a second planar sealing surface;
   the passage in the second planar sealing surface is aligned with and in fluid communication with the passage in the first planar sealing surface; and
   a third part having a third planar sealing surface clamped against the second O-ring, wherein the third part surrounds the second part.

2. The vacuum seal arrangement of claim 1, wherein the first and second O-rings have the same cross-sectional diameter, the dove-tail groove is a single dove-tail groove having an inner straight wall and an outer inclined wall and the square walled groove has an outer wall oriented 90° to the first planar sealing surface, the grooves having a depth less than the O-ring cross-sectional diameter and a central axis coincident with the central axis of the passage, wherein the passage opens into the inner portion of the square walled groove.

3. The vacuum seal arrangement of claim 1, wherein the O-rings have a cross-sectional diameter of about 0.1 to about 0.25 inch, the web is a flat interconnecting section between the O-rings, and the first and second O-rings have an inner diameter of about 0.5 to about 2 inches, wherein the first O-ring has an inner diameter larger than the inner diameter of the second O-ring.

4. The vacuum seal arrangement of claim 1, wherein the first and second O-rings have a cross-sectional diameter of about 0.1 to about 0.25 inch and the dove-tail groove is a single dove-tail groove having a straight wall and an inclined wall.

5. The vacuum seal arrangement of claim 1, wherein the first and second O-rings have a cross-sectional diameter of about 0.1 to about 0.25 inch and the dove-tail groove is a double dove-tail groove with an inner inclined wall and an outer inclined wall.

6. The vacuum seal arrangement of claim 1, wherein an inner surface of the second O-ring surrounds and is in fluid contact with the passage in the first planar sealing surface, and the second O-ring is inside the first O-ring with respect to the first planar sealing surface.

7. The vacuum seal arrangement of claim 1, wherein the dove-tail groove is separated from the square walled groove by an annular wall having an annular surface coplanar with the first planar sealing surface, the web overlying the annular surface.

8. The vacuum seal arrangement of claim 1, wherein an outer wall of the dove-tail groove is at an angle of 60° to 80° and the bottom of the dove-tail groove is wider than the opening of the dove-tail groove.

9. The vacuum seal arrangement of claim 1, wherein the bottom of the dove-tail groove and the bottom of the square walled groove are coplanar.

* * * * *